United States Patent
Tate, Jr. et al.

(10) Patent No.: US 7,109,685 B2
(45) Date of Patent: Sep. 19, 2006

(54) METHOD FOR ESTIMATING STATES AND PARAMETERS OF AN ELECTROCHEMICAL CELL

(75) Inventors: Edward D. Tate, Jr., Grand Blanc, MI (US); Mark W. Verbrugge, Troy, MI (US); Brian J. Koch, Berkley, MI (US); Damon R. Frisch, Troy, MI (US)

(73) Assignee: General Motors Corporation, Detroit, MI (US)

( * ) Notice: Subject to any disclaimer, the term of this patent is extended or adjusted under 35 U.S.C. 154(b) by 307 days.

(21) Appl. No.: 10/664,287

(22) Filed: Sep. 17, 2003

(65) Prior Publication Data

US 2005/0057255 A1     Mar. 17, 2005

(51) Int. Cl.
*H01M 10/44* (2006.01)
(52) U.S. Cl. .................................................. 320/132
(58) Field of Classification Search ............... 320/132, 320/149, DIG. 21; 324/426, 427, 430, 433
See application file for complete search history.

(56) References Cited

U.S. PATENT DOCUMENTS

| | | | | |
|---|---|---|---|---|
| 5,349,540 | A * | 9/1994 | Birkle et al. | 324/427 |
| 6,441,586 | B1 * | 8/2002 | Tate et al. | 320/132 |
| 6,618,681 | B1 * | 9/2003 | Hoenig et al. | 324/426 |
| 6,927,554 | B1 * | 8/2005 | Tate et al. | 320/132 |

* cited by examiner

*Primary Examiner*—Edward H. Tso
(74) *Attorney, Agent, or Firm*—Christopher DeVries

(57) ABSTRACT

A method of estimating a state of charge (SOC) and a state of health (SOH) of an electrochemical cell (EC) includes modeling the EC with a linear equation, measuring a terminal current of the EC, measuring a terminal voltage of the EC and measuring a temperature of the EC. The linear equation is processed through a time-varying state and parameter estimator based on the terminal current, the terminal voltage and the temperature to determine states and parameters of the EC.

23 Claims, 6 Drawing Sheets

METHOD FOR ESTIMATING STATES AND PARAMETERS OF AN ELECTROCHEMICAL CELL

FIELD OF THE INVENTION

The present invention relates to electrochemical power sources, and more particularly to determining states and parameters of an electrochemical power source.

BACKGROUND OF THE INVENTION

Electrical power sources, such as batteries or fuel cells, are made up of an array of electrochemical cells. The state of charge (SOC) of the electrochemical cell (EC) indicates the amount of usable energy stored within the EC at a given time. It is analogous to the amount of fuel in a fuel tank. In order to improve EC life and overall EC performance, the EC must be maintained at an optimal SOC. The state of health (SOH) of an EC indicates the physical condition of the EC. The SOH is based on observing particular EC parameters to determine the extent of unobservable, internal damage or degradation.

An EC can be considered a system that has current and heat flow as inputs and responses of voltage and temperature. The voltage response of the EC to current stimulation is described using a combination of voltages and a current source. These voltages include an equilibrium potential, voltage resulting from hysteresis effects, voltage resulting from ohmic resistance drops, and voltage resulting from dynamics in the EC, or double-layer voltage. Each of these voltages can be described by either an algebraic function, a differential equation or a convolution integral. The current source is indicative of a self-discharge current of the EC.

During use, resistance, equilibrium potential, voltage resulting from hysteresis effects, voltage resulting from ohmic resistance drops, double-layer voltage, and self-discharge current are not directly measurable. These values influence the SOC and the parameters that indicate the SOH of the EC. Because they are not directly measurable, it is often difficult to accurately determine the SOC and SOH of the EC. Therefore, it is difficult to maintain the EC at an optimal SOC or to determine when the SOH has degraded to a point where EC performance is significantly effected.

SUMMARY OF THE INVENTION

Accordingly, the present invention provides a method of estimating a state of charge (SOC) and a state of health (SOH) of an electrochemical cell (EC). The method includes modeling the EC with a linear equation, measuring a terminal current of the EC, measuring a terminal voltage of the EC and measuring a temperature of the EC. The linear equation is processed through a time-varying state and parameter estimator based on the terminal current, the terminal voltage and the temperature to determine states and parameters of the EC.

In one feature, the states include the SOC and ohmic resistance of the EC.

In another feature, the parameters include a variable, a charge variable and a discharge variable of the EC. The SOH is determined based on the variable, the charge variable and the discharge variable.

In another feature, the linear equation is a process model that models changes in the states and parameters of the EC based on current.

In another feature, the method further includes determining synthesized inputs based on the terminal current, the terminal voltage and the temperature. Processing is further based on the synthesized inputs.

In still another feature, the step of processing the linear equation includes predicting current states based on prior states and predicting current error of the states based on prior errors of the states. Current state gains are determined based on the current error of the states and the current states are updated based on the prior states and the current state gains to provide the states of the EC. The states include the SOC and ohmic resistance of the EC. The state errors are continuously updated.

In yet another feature, the step of processing the linear equation includes predicting current parameters based on prior parameters and predicting current error of the parameters based on prior errors of the parameters. Current parameter gains are determined based on the current error of the parameters and the current parameters are updated based on the prior parameters and the current parameter gains to provide the parameters of the EC. The parameters include a variable, a charge variable and a discharge variable of the EC, the parameter errors are continuously updated.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

The following description of the preferred embodiment is merely exemplary in nature and is in no way intended to limit the invention, its application, or uses. For purposes of clarity, the same reference numbers will be used in the drawings to identify similar elements.

Figure 1:
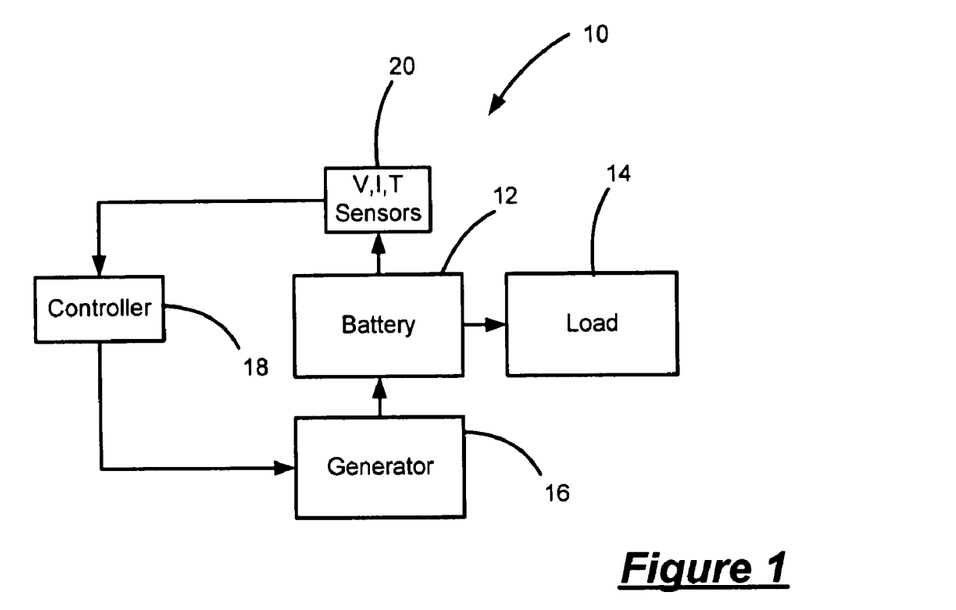
FIG. 1 is a functional block diagram of a system including a power source, a load powered by the battery and a generator to recharge the power source.

Referring now to FIG. 1, a system 10 includes a regenerative power source 12 that is discharged as it powers a load 14. The power source 12 is made up of an array of electrochemical cells (EC's) (not shown). The EC's are selectively recharged by a generator 16. Operation of the generator is controlled by a controller 18. Sensors 20 communicate with the EC's and generate a terminal voltage signal ($V_t$), a terminal current signal ($I_t$) and a temperature signal (T). The controller 18 processes the signals according to the estimator control of the present invention to estimate states and parameters of the EC's. The controller 18 signals the generator 16 to operate based on the estimates.

Although the system 10 is a generic power system, it is indicative of a vehicle power system. In such a case, the power source 12 powers loads such as headlamps, heaters, power seats, windows, and the like. The vehicle's engine drives the generator 16 (i.e. alternator), to produce recharging current.

Figure 2:
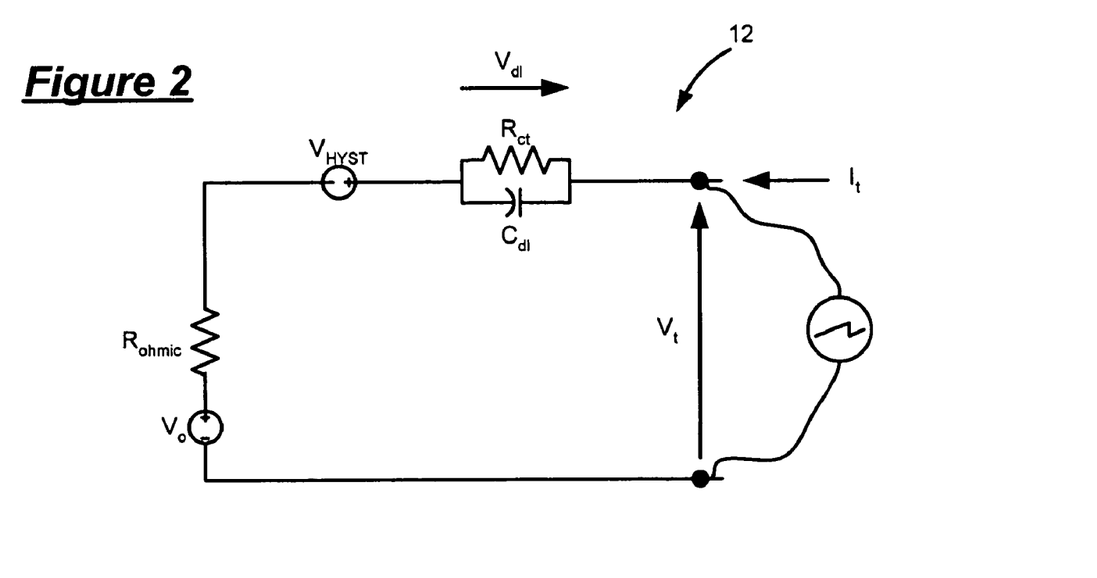
FIG. 2 is a schematic diagram of the power source.
Figure 3:
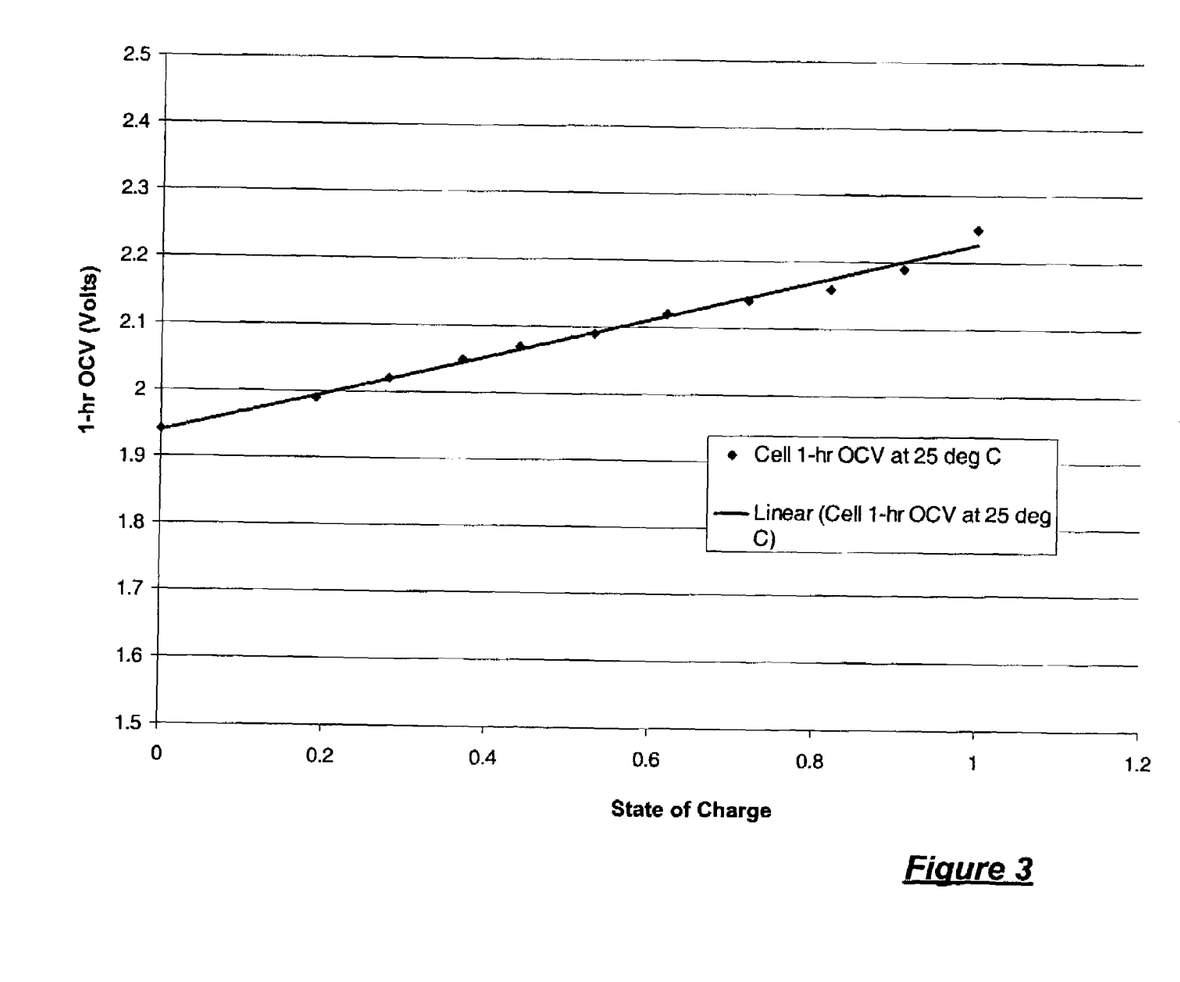
FIG. 3 is a graph illustrating state of charge (SOC) versus open-circuit voltage (OCV) for an exemplary lead-acid (Pba) electrochemical cell.

Referring now to FIG. 2, the power source is schematically modeled in terms of an equilibrium potential or open-circuit voltage ($V_o$), a voltage resulting from hysteresis effects ($V_{hyst}$), a voltage resulting from ohmic resistance drops ($V_{ohmic}$), a voltage resulting from dynamics in the battery or double-layer voltage ($V_{dl}$) and a self-discharge current ($I_{SD}$). $V_o$ can be determined based on $V_{dl}$ and $V_{hyst}$. $V_{dl}$ and $V_{hyst}$ are determined using an open loop model. These voltages are subtracted from a measurable terminal voltage ($V_t$) to determine V. Knowing $V_o$ is sufficient to estimate the SOC of the battery given a function that maps $V_o$ to SOC. An empirical fit of the SOC to $V_o$ for an exemplary power source is shown in FIG. 3. The exemplary power source of FIG. 3 is a PbA battery. Although the power source model of FIG. 2 does not include all of the existing behaviors, testing and experience has shown that this model is sufficient for SOC estimation, power control and diagnostics for automotive applications.

The present invention provides a general state and parameter estimator to estimate the SOC and SOH of an EC. The SOC and SOH estimates are used to operate and/or diagnose the EC or array of EC's. The estimator is a Kalman Filter (KF)-based state and parameter estimator. A standard Kalman Filter (KF) combines the concept of recursive least squares estimation with a state space model and noise model to optimally estimate a system characteristic. The KF estimates the characteristic of the system based on a linear model of the system. The linear model of the system includes a linear dynamic model, a description of the covariance of the errors in the system dynamics, and a description of the covariance of the errors in system measurements. The linear model is expressed in state space form as:

$x_{k+1}=A_k x_k+B_k u_k+w_k$ (Process Model); and $y_k=F_k x_k+G_k u_k+r_k$ (Measurement Model)

where:
- $x_k$ is the state vector (i.e. what is to be estimated);
- $y_k$ is the measurement vector (known);
- $u_k$ is the deterministic input to the battery (known);
- $w_k$ is the process noise (i.e. random inputs into the system);
- $r_k$ is the measurement noise (i.e. random noise that affects measurements); and
- $A_k$, $B_k$, $F_k$, $G_k$ are the system matrices (known).

The KF estimates the characteristic by using a form of feedback control. In short, the KF estimates the characteristic at some time and then obtains feedback in the form of noisy measurements. The KF equations fall into two groups: time update equations (predictor) and measurement equations (corrector). The time update equations project the current characteristic and error covariance estimates to obtain estimates for the next time step. The measurement update equations incorporate new measurements into the estimates to obtain an improved or updated estimate.

The KF-based estimator of the present invention introduces a mechanism that propagates state and parameter estimates (x and p, respectively) based on EC dynamics. The estimator propagates the estimate error covariance based on EC dynamics and knowledge of how noise affects the EC. The EC is a non-linear system. However, the KF-based state and parameter estimator simplifies the system by either linearizing non-linearities or removing them. Further, the KF-based state and parameter estimator accounts for time varying parameters to more quickly improve estimate errors. The controller processes the KF-based state and parameter estimator and controls other components of the system 10 in response to the state and parameter estimates.

The state estimates generally include SOC, ohmic resistance ($R_o$) and double layer voltage ($V_{dl}$). As used herein, the acronym VRV indicates the state estimates. The parameter estimates include a variable (f), a charge variable ($b_{charge}$) and a discharge variable ($b_{discharge}$). As used herein, the acronym fbb indicates the parameter estimates. The variables f, $b_{charge}$ and $b_{discharge}$ are based on the dynamic impedance ($Z_{dyn}$) of the EC. $Z_{dyn}$ is based on the resistance ($R_{ct}$), double layer capacitance ($C_{dl}$) and time constant (T).

As used herein, the notation k indicates the present iteration of time. The notation k|k indicates the present iteration evaluated using information presently available (i.e. updating or correcting). The notation k|k−1 indicates the present iteration evaluated using past (stored) information (i.e. estimating). Additionally, the notation $z^{-N}$, more specifically $z^{-1}$, indicates a unit delay.

In general, the ECSP estimator includes six processing models: a synthesis model, a state prediction model, a parameter prediction model, a measurement model, an estimate correction model and an error propagation model. The notation (^) indicates variables determined using the measurement model. Initially, $V_t$, $I_t$ and T are measured for the EC. These values are processed through the synthesis model to provide an input vector $u_{syn}$. The input vector is provided as:

$$u_{syn} = \begin{bmatrix} V_t \\ I_k \\ I_{charge,k} \\ I_{discharge,k} \\ T \end{bmatrix}$$

where:

$I=I_t-f_{SD}(Q_{soc,k|k},T)$ $I_{charge}=\max(0,I)$ $I_{discharge}=\min(0,I)$

The measurement model is provided as:

$$\hat{V}_t = f_{QtoV}(Q_{SOC,k|k-1}, T) + \frac{I}{1000} \cdot R_{o,k|k-1} + V_{dl,k|k-1}$$

$$\hat{V}_{dl} = f_{k|k-1} \cdot \left(\hat{V}_{dl,k|k} \cdot z^{-1}\right) + b_{c,k|k-1} \cdot \left(\frac{I_c}{1000}\right) + b_{d,k|k-1}\left(\frac{I_d}{1000} \cdot z^{-1}\right)$$

$$\hat{y} = \begin{bmatrix} \hat{V}_t \\ \hat{V}_{dl} \end{bmatrix}$$

The state prediction model propagates (predicts) the estimated state and parameter values ($x_k, \rho_k$) and the covariance (P) of the respective estimate errors based on prior information. The state prediction model is provided as:

$$\eta_{CE} = f_{chargeff}(Q_{SOC,k|k}, T)$$

$$Q_{SOC,k|k-1} = Q_{SOC,k|k} + (\eta_{CE} \cdot I_c + I_d) \cdot \frac{1}{3600}$$

$$V_{dl,k|k-1} = f_{k|k} \cdot V_{dl,k|k} + b_{c,k|k} \cdot \frac{I_c}{1000} + b_{d,k|k} \cdot \frac{I_d}{1000}$$

$$x_{k|k-1} = \begin{bmatrix} Q_{SOC,k|k-1} \\ V_{dl,k|k-1} \end{bmatrix}$$

The parameter prediction model is provided as:

$$R_{o,k|k-1} = R_{o,k|k}$$

$$f_{k|k-1} = f_{k|k}$$

$$b_{c,k|k-1} = b_{c,k|k}$$

$$b_{d,k|k-1} = b_{d,k|k}$$

$$\rho_{k|k-1} = \begin{bmatrix} R_{o,k|k-1} \\ f_{k|k-1} \\ b_{c,k|k-1} \\ b_{d,k|k-1} \end{bmatrix}$$

The next measurement is obtained and the estimator updates (corrects) the predicted $x_k$ and $\rho_k$ based on the current measurements. The predicted covariance (P) of the respective estimate errors is updated based on the measurements. The order of these operations can vary.

The estimator implements the following relationships and matrices for state estimation:

$$A_{VRV} = \begin{bmatrix} 1 & 0 & 0 \\ 0 & 1 & 0 \\ 0 & 0 & x_{fbb,k|k-1} \end{bmatrix}$$

$$B_{VRV} = \begin{bmatrix} 0 & f_{charg\,eff}(Q_{soc,k-1}, T_k, I_k) & 1 \\ 0 & x_{fbb,k|k-1}/1000 & 0 \\ 0 & 0 & x_{fbb,k|k-1}/1000 \end{bmatrix}$$

$$C_{VRV} = \begin{bmatrix} f_{V/Q}(Q_{SOC,k|k}, T_k) & \frac{I_k}{1000} & 1 \end{bmatrix}$$

$$Q_{VRV} = f_{Q_{VRV}}(Q_{SOC,k|k}, T, I)$$

$$R_{VRV} = f_{R_{VRV}}(I)$$

The state estimate correction model includes a state gain matrix ($K_{VRV}$) based on the state error covariance ($P_{VRV,k|k-1}$), the matrix $C_{VRV}$ and $R_{VRV}$. $K_{VRV}$ is calculated according to the following equation:

$$K_{VRV} = P_{VRV,k|k-1} \cdot C_{VRV}^t \cdot (C_{VRV} \cdot P_{VRV,k|k-1} \cdot C_{VRV}^t + R_{VRV})^{-1}$$

A previously stored state estimate ($x_{k|k-1}$) is updated to determine a present state estimate ($x_{k|k}$). The current state estimate is determined based on $x_{k|k-1}$, $K_{VRV}$ and an a posteriori error ($e_{VRV}$). The error is defined as the difference between the actual $V_t$ and the terminal voltage based on the measurement ($\hat{V}_t$). The present state estimate is determined according to the following equation:

$$x_{VRV,k|k} = x_{VRV,k|k-1} + K_{VRV} \cdot e_{VRV}$$

The state estimate is propagated based on the present state estimate according to the following equation:

$$x_{VRV,k+1|k} = A_{VRV} x_{VRV,k|k} + B_{VRV} u_{VRV}$$

The state estimate error covariance ($P_{VRV}$) is propagated based on the updated state estimate error covariance $P_{VRV,k}$ according to the following equation:

$$P_{VRV,k+1|k} = A_{VRV} \cdot P_{VRV,k|k} \cdot A_{VRV}^t + Q_{VRV}$$

To summarize state estimation, the estimator inputs include: $V_{t,k}$, $I_{t,k}$, $T_k$, $\rho_{fbb,k|k-1}$, $x_{VRV,k|k-1}$ and $P_{VRV,k|k-1}$. The values $V_{t,k}$, $I_{t,k}$ and $T_k$ are directly measured from the EC. The values $x_{VRV,k|k-1}$ and $P_{VRV,k|k-1}$ are previously determined and retrieved from memory. The estimator outputs include: $x_{VRV,k+1|k}$, $P_{VRV,k+1|k}$, $x_{VRV,k|k}$ and $P_{VRV,k|k}$. The values $x_{VRV,k+1|k}$ and $P_{VRV,k+1|k}$ are stored in memory for use during the next iteration. The value $x_{VRV,K|k}$ defines the estimated SOC, ohmic resistance ($R_o$) and double layer voltage ($V_{dl}$). These values are used to operate the system and/or diagnose the EC.

The estimator implements the following relationships and matrices for parameter estimation:

$$V_{dl,k|k} = x_{VRV,k|k}$$

$$V_{dl,k-1|k-1} = x_{VRV,k-1|k-1}$$

$$y_{fbb,k} = V_{dl,k|k}$$

$$f_{k-1} = \rho_{fbb,k-1|k-1}$$

$$C_{fbb} = \begin{bmatrix} V_{dl,k-1|k-1} & \frac{I_{c,k-1}}{1000} & \frac{I_{d,k-1}}{1000} \end{bmatrix}$$

$$Q_{fbb} = f_{fbb\_Q}(\ldots)$$

$$R_{fbb} = (1 + f_{k-1}) \cdot P_{VRV,k|k}$$

To estimate $\rho_{fbb}$, the estimate correction model includes a parameter gain matrix ($K_{fbb}$) based on the parameter error covariance ($P_{fbb,k|k-1}$), the matrix $C_{fbb}$ and $R_{fbb}$. $K_{fbb}$ is calculated according to the following equation:

$$K_{fbb} = P_{fbb,k|k-1} \cdot C_{fbb}^t \cdot (C_{fbb} \cdot P_{fbbk|k-1} \cdot C_{fbb}^t + R_{fbb})^{-1}$$

A previously stored parameter estimate ($\rho_{k|k-1}$) is updated to determine a current parameter estimate ($\rho_{k|k}$). The current parameter estimate is determined based on $\rho_{k|k-1}$, $K_{fbb}$ and an a posteriori error ($e_{fbb,k}$). The error is defined as the difference between the actual $V_{dl}$ and the $\hat{V}_{dl}$, which is based on the measurement. The current parameter estimate is determined according to the following equation:

$$\rho_{fbb,k|k}\rho_{fbb,k|k-1} + K_{fbb} \cdot e_{fbb}$$

The parameter estimate error covariance ($P_{fbb}$) is propagated according to the following equation:

$$P_{fbb,k+1|k} = A_{fbb} \cdot P_{fbb,k|k} \cdot A_{fbb}^t + Q_{fbb}$$

The parameter estimate is propagated based on the present state estimate according to the following equation:

$$\rho_{fbb,k+1|k} = A_{fbb} \cdot \rho_{fbb,k|k} + B_{fbb} \cdot u_{fbb}$$

To summarize parameter estimation, the estimator inputs include: $I_{t,k}$, $T_k$, $\rho_{fbb,k|k-1}$, $x_{VRV,k|k}$, $x_{VRV,k-1|k-1}$, $P_{VRV,k|k}$, $x_{fbb,k|k-1}$ and $P_{fbb,k|k-1}$. The values $I_{t,k}$ and $T_k$ are directly measured from the EC. The values $\rho_{fbb,k|k-1}$, $x_{VRV,k|k-1}$ and $P_{VRV,k|k-1}$ are previously determined and retrieved from memory. The estimator outputs include: $\rho_{fbb,k+1|k}$, $P_{fbb,k+1|k}$, $\rho_{fbb,k|k}$ and $P_{fbb,k|k}$. The values $\rho_{fbb,k+1|k}$ and $P_{fbb,k+1|k}$ are stored in memory for use during the next iteration. The value $\rho_{fbb,k|k}$ defines the estimated ohmic resistance ($R_o$), f, $b_{charge}$ and $b_{discharge}$. These values are used to operate the system and/or diagnose the EC.

Figure 4:
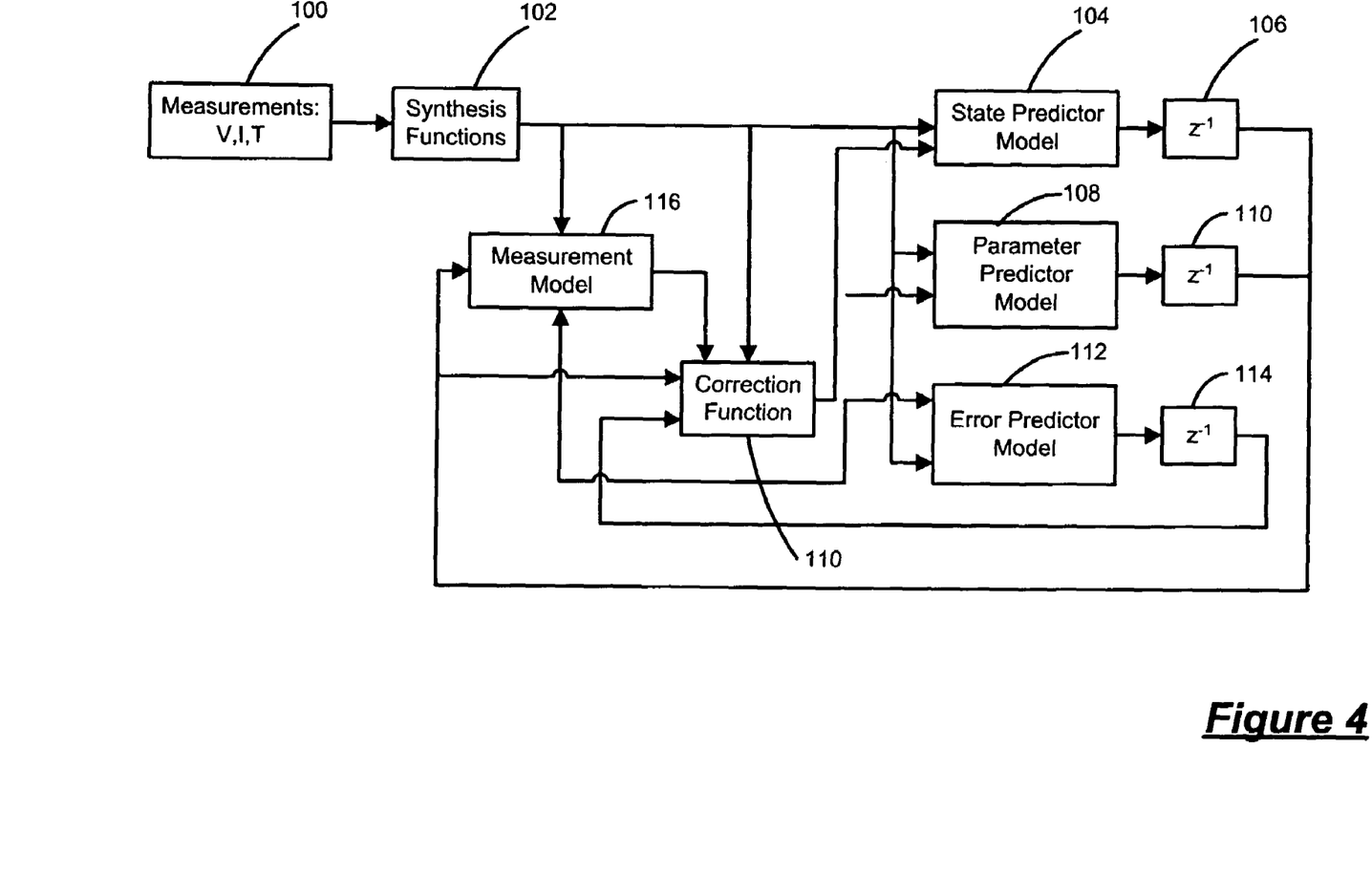
FIG. 4 is a signal flow diagram of an electrochemical cell state and parameter estimator according to the present invention.

Referring now to FIG. 4, a signal flow for the general EC state and parameter (ECSP) estimator will be described. Voltage (V), current (I) and temperature (T) are measured for the EC at 100. At 102, the V, I and T signals are processed through the synthesis functions by the controller 18. As described above, the synthesis functions produce the input vector signal ($u_{syn}$). The input vector signal ($u_{syn}$) is processed in the various models and functions of the ECSP estimator.

The input vector signal is processed through the state predictor model to produce a state estimate signal ($x_{k|k-1}$) at 104. The state estimate signal is stored in a buffer at 106 for later processing. At 108, the parameter predictor model processes the input vector signal to produce a parameter estimate signal ($\rho_{k|k-1}$). The parameter estimate signal is stored in a buffer at 110 for later processing. The input vector signal is processed through the error predictor model at 112 to produce an error estimate signal ($P_{k|k-1}$). The error estimate signal is stored in a buffer for later processing at 114.

The state and parameter estimate signals ($x_{k|k-1}$, $\rho_{k|k-1}$) are pushed from their respective buffers to the measurement model at 116. The input signal ($u_{syn}$) and corrected state, parameter and error signals ($x_{k|k}$, $\rho_{k|k}$, $P_{k|k}$, respectively) are processed in the measurement model with the estimated state and parameter estimate signals ($x_{k|k-1}$, $\rho_{k|k-1}$). The measurement model produces a voltage signal (y).

At 118, the voltage signal (y) is processed through the correction function with the input signal ($u_{syn}$), the state and parameter estimate signals ($x_{k|k-1}$, $\rho_{k|k-1}$) and the error estimate signal ($P_{k|k-1}$). The correction function produces the corrected state signal ($x_{k|k}$), the corrected parameter signal ($\rho_{k|k}$), and a corrected error signal ($P_{k|k}$). The corrected state signal is processed with the input signal through the state predictor model to produce the state estimate signal. The corrected parameter signal is processed with the input signal through the parameter predictor model to produce the parameter estimate signal. The corrected error signal is processed with the input signal through the error predictor model to produce the error estimate signal.

Figure 5:
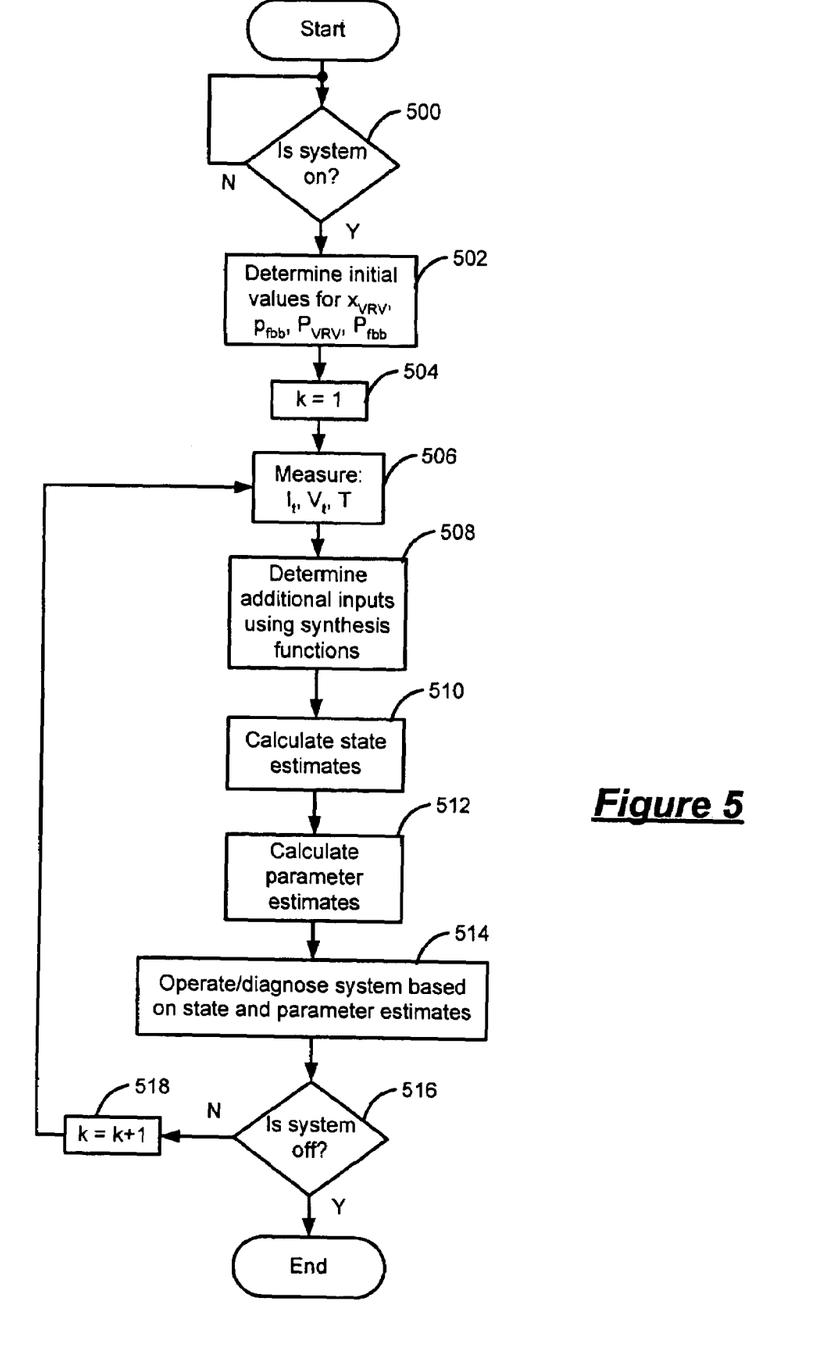
FIG. 5 is a flowchart illustrating the electrochemical cell state and parameter estimation control according to the present invention.

Referring now to FIG. 5, the ECSP estimator control will be described in detail. In step 500, control determines whether the system is on. If so, control continues in step 502. If not, control loops back. Control determines initial values for $x_{VRV}$, $\rho_{fbb}$, $P_{VRV}$ and $P_{fbb}$ in step 502. Initial values for the power source states and parameters are pre-programmed in memory. Certain assumptions are required to determine these initial values. The initial values are selected to minimize the error between the actual states and the assumed states to enable quicker error reduction. Assumptions are also required for the measurement and process noises. In step 504, control sets a counter (k) equal to 1.

In step 506, the voltage($V_t$), current ($I_t$) and temperature (T) are measured. In step 508, control processes the measurements with the synthesis functions to produce the input signal. This is described in further detail with reference to FIG. 6. Control determines the corrected state estimates and the corrected parameter estimates in steps 510 and 512, respectively. Calculation of the corrected state estimates and the corrected parameter estimates is described in more detail with reference to FIGS. 7 and 8, respectively.

In step 514, control operates and/or diagnoses the system based on the corrected state and parameter estimates. In step 516, control determines whether the system is off. If not, control increments the counter in step 518 and loops back to step 506. If so, control ends.

Figure 6:
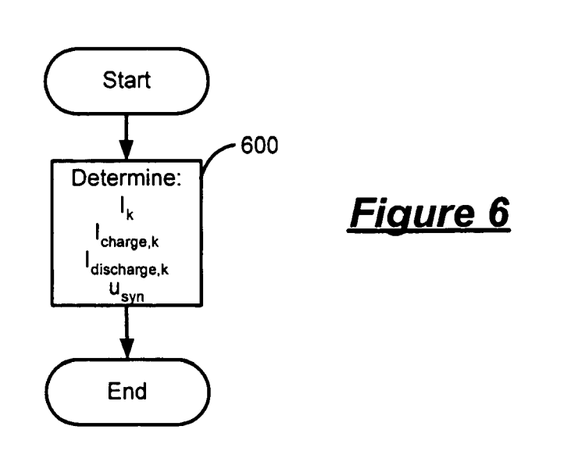
FIG. 6 is a flowchart illustrating processing of synthesis functions for the electrochemical cell state and parameter estimation control of FIG. 4.

Referring now to FIG. 6, control determines the input signal ($u_{syn}$) based on the measurements $V_t$, $I_t$ and T in step 600. In particular, control determines I, $I_c$ and $I_d$. As described above, the input signal ($u_{syn}$) is a vector including $V_t$, I, $I_c$, $I_d$ and T.

Figure 7:
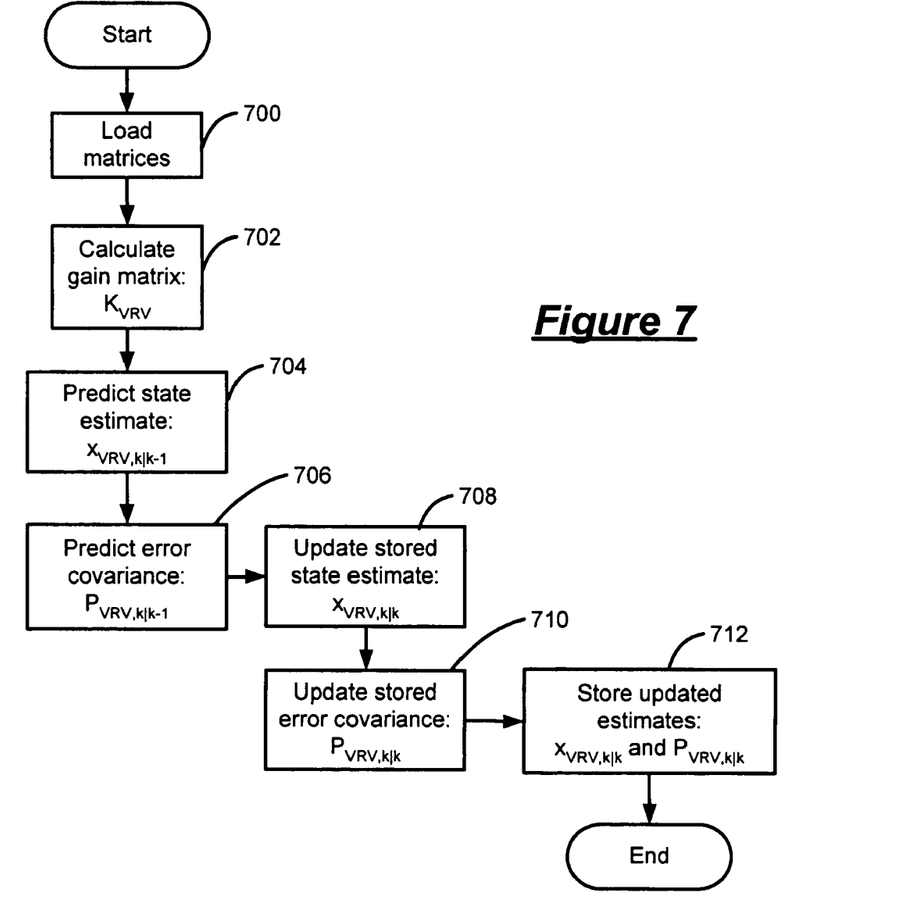
FIG. 7 is a flowchart illustrating state estimation for the electrochemical cell state and parameter estimation control of FIG. 4.

Referring now to FIG. 7, the process to determine the state estimate will be described. In step 700, control loads the matrices used to determine the VRV state estimate. These matrices are shown above. Control calculates the state gain matrix ($K_{VRV}$) in step 702. In step 704, control estimates the current state estimate ($x_{VRV,k|k-1}$) based on prior information. In step 706, control estimates the current error covariance estimate ($P_{VRV,k|k-1}$) based on prior information. In step 706, control updates the stored state estimate ($x_{VRV,k|k}$). In step 710, control updates the stored error covariance estimate ($P_{VRV,k|k}$). In step 712, control stores the updated estimates $x_{VRV,k|k}$ and $P_{VRV,k|k}$.

Figure 8:
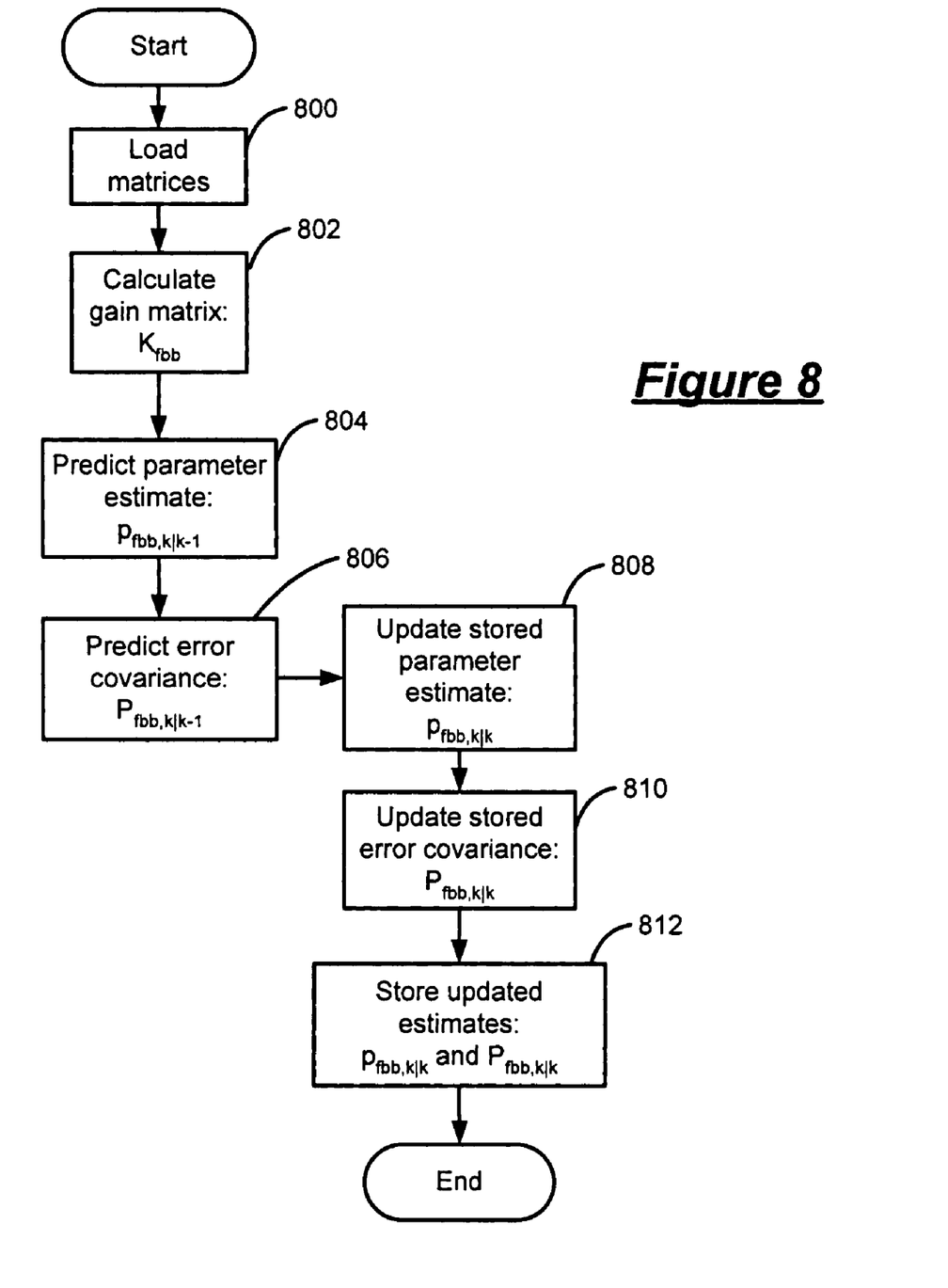
FIG. 8 is a flowchart illustrating parameter estimation for the electrochemical cell state and parameter estimation control of FIG. 4.

Referring now to FIG. 8, the process to determine the parameter estimate will be described. In step 800, control loads the matrices used to determine the parameter estimate (fbb). These matrices include are described above. Control calculates the parameter gain matrix ($K_{fbb}$) in step 802. In step 804, control estimates the current parameter estimate ($\rho_{fbb,k|k-1}$) based on prior information. In step 806, control estimates the current error covariance estimate ($P_{fbb,k|k-1}$) based on prior information. In step 810, control updates the stored parameter estimate ($\rho_{fbb,k|k}$). In step 810, control updates the stored error covariance estimate ($P_{fbb,k|k}$). In step 812, control stores the updated estimates $\rho_{fbb,k|k}$ and $P_{fbb,k|k}$.

In sum, the ECSP estimator process $V_{t,k}$, $I_{t,k}$ and T through the various models to provide estimate stats and parameter outputs.

The state outputs are provided as:

$$x_{VRV,k+1|k} = \begin{bmatrix} Q_{SOC} \\ R \\ V_{dl} \end{bmatrix}$$

The parameter outputs are provided as:

$$\rho_{jbb,k+1|k} = \begin{bmatrix} f \\ b_{o,charge} \\ b_{o,discharge} \end{bmatrix}$$

The state and parameter outputs are used to operate and diagnose the power source.

The present invention further provides variants of the general ECSP estimator described in detail above. The estimator variants described herein operate using the same logic as described in FIGS. 5 through 8. However, the relationships and matrices that power the variants vary based on the particular design goal of each.

A first variant is directed toward symmetric or asymmetric impedance batteries. The first variant uses a general characterization of the EC, introduces hysteresis effects and uses multiple independent descriptions of estimate errors. The first variant estimator can be used on either symmetric or asymmetric impedance EC's with only calibration changes. The use of characterization data to improve estimator performance with little additional processing. The characterization data includes the rate of change on R, f and b with respect to state variables such as Q and T. Exemplary characterization data includes: dR/DQ, dR/dT, df/dQ, df/dT, db/dQ and db/dT.

The first variant inputs are provided as:

$$u_{syn} = \begin{bmatrix} I \\ I_{charge} \\ I_{discharge} \end{bmatrix}$$

$$y_{syn} = [V_t]$$

where the synthesis model provides:

$$I = I_t - I_{SD}(Q_{soc,k|k}, T)$$

$$I_c = \max(I, 0)$$

$$I_d = \min(I, 0)$$

The equations of the state prediction model for the first estimator variant are provided as:

$$\eta_{CE} = f_{chargeeff}(Q_{SOC,k|k}, T)$$

$$r = f_r(Q_{SOC,k|k}, T)$$

$$f_o = f_f(Q_{SOC,k|k}, T)$$

$$b_o = f_b(Q_{SOC,k|k}, T)$$

$$Q_{SOC,k|k-1} = Q_{SOC,k|k} + (\eta_{CE} \cdot I_c + I_d) \cdot \frac{1}{3600}$$

$$Q_{H,k|k-1} = \beta(I_c \cdot \eta_{CE} + I_d) \cdot [Q_{H,max}(Q_{SOC,k|k}, T) - \text{sign}(I) \cdot Q^H_{k|k}]$$

$$V_{dl,k|k-1} = (f_{offset,k|k} + f_o) \cdot V_{dl,k|k} + (b_{offset,k|k} + b_o) \cdot \left(\frac{I_c}{1000} + r \cdot \frac{I_d}{1000}\right)$$

$$x_{k|k-1} = \begin{bmatrix} Q_{SOC,k|k-1} \\ V_{dl,k|k-1} \\ Q_{H,k|k-1} \end{bmatrix}$$

The equations of the parameter prediction model for the first estimator variant are provided as:

$$dRdQ = f_{dRdt}(Q_{SOC,k|k}, T)$$

$$dRdT = f_{dRdt}(Q_{SOC,k|k}, T)$$

$$R_{offset,k|k-1} = R_{offset,k|k} + dRdQ \cdot \left(\frac{Q_{SOC,k|k} \cdot (1 - z^{-1})}{T_s}\right) + dRdT \cdot \left(\frac{T \cdot (1 - z^{-1})}{T_s}\right)$$

$$dfdQ = f_{dfdt}(Q_{SOC,k|k}, T)$$

$$dfdT = f_{dfdT}(Q_{SOC,k|k}, T)$$

$$f_{offset,k|k-1} = f_{offset,k|k} + dfdQ \cdot \left(\frac{Q_{SOC,k|k} \cdot (1 - z^{-1})}{T_s}\right) + dfdT \cdot \left(\frac{T \cdot (1 - z^{-1})}{T_s}\right)$$

$$dbdQ = f_{dfdt}(Q_{SOC,k|k}, T)$$

$$dbdT = f_{dfdT}(Q_{SOC,k|k}, T)$$

$$b_{offset,k|k-1} = b_{offset,k|k} + dbdQ \cdot \left(\frac{Q_{SOC,k|k} \cdot (1 - z^{-1})}{T_s}\right) + dbdT \cdot \left(\frac{T \cdot (1 - z^{-1})}{T_s}\right)$$

$$\rho_{k|k-1} = \begin{bmatrix} R_{offset,k|k-1} \\ f_{offset,k|k-1} \\ b_{offset,k|k-1} \end{bmatrix}$$

The equations of the measurement model for the first estimator variant are provided as:

$$R_o = f_{R_o}(Q_{SOC,k|k}, T)$$

$$\hat{V} = f_{QtoV}(Q_{SOC,k|k-1}, T) + \frac{I}{1000} \cdot (R_o + R_{offset,k|k-1}) + V_{dl,k|k-1} + f_{Q_H toV_H}(Q_{SOC,k|k-1}, Q_{H,k|k-1})$$

$$r = f_r(Q_{SOC,k|k}, T)$$

$$f_o = f_{f1}(Q_{SOC,k|k}, T)$$

$$b_o = f_b(Q_{SOC,k|k}, T)$$

$$\hat{V}_{dl} = (f_o + f_{offset,k|k-1}) \cdot (V_{dl,k|k} \cdot z^{-1}) +$$
$$(b_o + b_{offset,k|k-1}) \cdot \left(\frac{I_c}{1000} \cdot z^{-1} + r \cdot \frac{I_d}{1000} \cdot z^{-1}\right)$$

$$\hat{y} = \begin{bmatrix} \hat{V}_t \\ \hat{V}_{dl} \end{bmatrix}$$

The equations of the estimate correction model for the first estimator variant are provided as:

$$C_{VRV} = [f_{cVdQ}(Q_{SOC,k|k-1},T) + f_{dRdQ}(Q_{SOC,k|k-1},T) \cdot III f_{dVdQ_H}(Q_{SOC,k|k-1},T)]$$

$$R_{VRV} = f_{R_{VRV}}(I)$$

$$x_{VRV,k|k-1} = \begin{bmatrix} Q_{SOC,k|k-1} \\ R_{offset,k|k-1} \\ V_{dl,k|k-1} \\ Q_{H,k|k-1} \end{bmatrix}$$

$$e_{VRV} = V_t - \hat{V}_t$$

$$K_{VRV} = P_{VRV,k|k-1} \cdot C^t_{VRV} \cdot (C_{VRV} \cdot P_{VRV,k|k-1} \cdot C^t_{VRV} + R_{VRV})^{-1}$$

$$x_{VRV,k|k} = \begin{bmatrix} Q_{SOC,k|k} \\ R_{offset,k|k} \\ V_{dl,k|k} \\ Q_{H,k|k} \end{bmatrix} = x_{VRV,k|k-1} + K_{VRV} \cdot e_{VRV}$$

$$P_{VRV,k|k} = (1 - K_{VRV} \cdot C_{VRV}) \cdot P_{VRV,k|k-1}$$

$$r = f_r(Q_{SOC,k|k},T)$$

$$C_{fbb} = [V_{dl,k|k} \cdot z^{-1}(I_c \cdot z^{-1} + (r \cdot I_d) \cdot z^{-1})]$$

$$f_o = f_f(Q_{SOC,k|k},T)$$

$$R_{fbb} = (1 + f_o + f_{plus}) \cdot P_{VRV,k|k}$$

$$x_{fbb,k|k-1} = \begin{bmatrix} f_{offset,k|k-1} \\ b_{offset,k|k-1} \end{bmatrix}$$

$$e_{fbb} = V_{dl,k|k} - \hat{V}_{dl}$$

$$K_{fbb} = P_{fbb,k|k-1} \cdot C^t_{fbb} \cdot (C_{fbb} \cdot P_{fbb,k|k-1} \cdot C^t_{fbb} + R_{fbb})^{-1}$$

$$x_{fbb,k|k} = \begin{bmatrix} f_{offset,k|k} \\ b_{offset,k|k} \end{bmatrix} = x_{fbb,k|k-1} + K_{fbb} \cdot e_{fbb}$$

$$P_{fbb,k|k} = (1 - K_{fbb} \cdot C_{fbb}) \cdot P_{fbb,k|k-1}$$

The equations of the error propagation model for the first estimator variant are provided as:

$$f_o = f_f(Q_{SOC,k|k},T)$$

$$A_{VRV} = \begin{bmatrix} 1 & 0 & 0 & 0 \\ 0 & 1 & 0 & 0 \\ 0 & 0 & (f_o + f_{offset,k|k}) & 0 \\ 0 & 0 & 0 & 1 \end{bmatrix}$$

$$Q_{VRV} = f_{Q_{VRV}}(Q_{SOC,k|k},T,I)$$

$$Q_{fbb} = f_{Q_{fbb}}(Q_{SOC,k|k},T,I)$$

$$P_{VRV,k|k-1} = A_{VRV} \cdot P_{VRV,k|k} \cdot A^t_{VRV} + Q_{VRV}$$

$$P_{fbb,k|k-1} = P_{fbb,k|k} + Q_{fbb}$$

$$P_{k|k-1} = \{P_{VRV,k|k-1}, P_{fbb,k|k-1}\}$$

The outputs of the second variant are provided as:

$$x_{k|k} = \begin{bmatrix} Q_{SOC} \\ V_{dl} \\ Q_H \end{bmatrix}$$

$$\rho_{k|k} = \begin{bmatrix} R_{offset} \\ f_{offset} \\ b_{offset} \end{bmatrix}$$

$$P_{k|k} = \{P_{VRV}, P_{fbb}\}$$

A second variant learns the impulse response of the linearized system to learn the impedance of the system. The second variant uses a finite impulse response and ordinary differential equation parameters to adapt to the power source characteristics using a single, unified description of the estimate errors (i.e. single matrix). The impulse response is learned as a set of discrete values that are spaced in time. The difference between the predicted output and the measured output is used to drive updates to the learned impulse response.

The input vector of the second variant is provided as:

$$u_{syn} = \begin{bmatrix} V_t \\ I \\ I_c \\ I_d \\ T \end{bmatrix}$$

where:

$$I = I_t - I_{SD}(Q_{soc,k|k},T)$$

$$I_{c,inst} = \max(I,0)$$

$$I_{d,inst} = \min(I,0)$$

$$\mathbf{I}_c = [I_{c,inst}, I_{c,inst} \cdot z^{-1}, I_{c,inst} \cdot z^{-2}, \ldots]^t$$

$$\mathbf{I}_d = [I_{d,inst}, I_{d,inst} \cdot z^{-1}, I_{d,inst} \cdot z^{-2}, \ldots]^t$$

The equations of the state prediction model for the second estimator variant are provided as:

$\eta_{CE} = f_{chargeeff}(Q_{SOC,k|k}, T)$ $r = f_r(Q_{SOC,k|k}, T)$ $f_o = f_f(Q_{SOC,k|k}, T)$ $b_o = f_b(Q_{SOC,k|k}, T)$ $$Q_{SOC,k|k-1} = Q_{SOC,k|k} + (\eta_{CE} \cdot I_c + I_d) \cdot \frac{1}{3600}$$

$Q_{H,k|k-1} = \beta(I_c \cdot \eta_{CE} + I_d) \cdot [Q_{H,max}(Q_{SOC,k|k}, T) - \text{sign}(I) \cdot Q_{H,k|k}]$ $$V_{dl,k|k-1} = (f_o) \cdot V_{dl,k|k} + (b_o) \cdot \left(\frac{I_c}{1000} + r \cdot \frac{I_d}{1000}\right) \cdot z^{-n}$$

$$x_{k|k-1} = \begin{bmatrix} Q_{SOC,k|k-1} \\ V_{dl,k|k-1} \\ Q_{H,k|k-1} \end{bmatrix}$$

The equations of the parameter prediction model for the second estimator variant are provided as:

$Z_{c,k|k-1} = Z_{c,k|k}$ $Z_{d,k|k-1} = Z_{d,k|k}$ $$\rho_{k|k-1} = \begin{bmatrix} Z_{c,k|k-1} \\ Z_{d,k|k-1} \end{bmatrix}$$

The equations of the measurement model for the second estimator variant are provided as:

$\hat{V}_t = f_{QtoV}(Q_{SOC,k|k-1}, T) + Q_H + I_c^t \cdot Z_{c,k|k-1} + I_d^t \cdot Z_{d,k|k-1} + V_{dyn}$ $\hat{y} = [\hat{V}_t]$ The equations of the estimate correction model for the second estimator variant are provided as:

$C = [\, f_{dVdQ}(Q_{SOC,k|k-1}, T) \quad f_{dVdQ_H}(Q_{SOC,k|k-1}, T) \quad 1 \quad I_c^t \quad I_d^t \,]$ $R = f_R(I)$ $$x_{k|k-1} = \begin{bmatrix} Q_{SOC,k|k-1} \\ Q_{H,k|k-1} \\ V_{dyn,k|k-1} \\ Z_{c,k|k-1} \\ Z_{d,k|k-1} \end{bmatrix}$$

$e = V_t - \hat{V}_t$ $K = P_{k|k-1} \cdot C^t \cdot (C \cdot P_{k|k-1} \cdot C^t + R)^{-1}$ $$x_{k|k} = \begin{bmatrix} Q_{SOC,k|k} \\ R_{offset,k|k} \\ V_{dl,k|k} \\ Q_{H,k|k} \end{bmatrix} = x_{k|k-1} + K \cdot e$$

$P_{k|k} = (1 - K \cdot C) \cdot P_{k|k-1}$

The equations of the error propagation model for the second estimator variant are provided as:

$Q = f_Q(Q_{SOC,k|k}, T, I)$ $$A = \begin{bmatrix} 1 & 0 & 0 & 0 & 0 \\ 0 & f_o & 0 & 0 & 0 \\ 0 & 0 & 1 & 0 & 0 \\ 0 & 0 & 0 & 1 & 0 \\ 0 & 0 & 0 & 0 & 1 \end{bmatrix}$$

$P_{k|k-1} = A \cdot P_{k|k} \cdot A^t + Q$

The output of the second variant is provided as:

$x_{k|k} = \lfloor Q_{SOC,k|k} \rfloor$ $$\rho_{k|k} = \begin{bmatrix} Z_{c,k|k} \\ Z_{d,k|k} \end{bmatrix}$$

A third variant is directed toward simple impedance estimation. In cases such as diagnostics (e.g. diagnosing weak EC's) or determining the characteristics of chemical reactions occurring within an EC (e.g. interface characteristics of a fuel cell), it is only necessary to learn the resistance and voltage dynamics of the EC. The third variant achieves this using a known open-circuit voltage ($V_o$).

The input vector of the third variant is provided as:

$$u_{syn} = \begin{bmatrix} V_t \\ I \\ I_c \\ I_d \\ T \end{bmatrix}$$

where:

$I = I_t - I_{SD}(Q_{SOC,k|k}, T)$ $I_c = \max(I, 0)$ $I_d = \min(I, 0)$

The equations of the state prediction model for the third estimator variant are provided as:

$r = f_r(Q_{SOC,k|k}, T)$ $$V_{dl,k|k-1} = (f_{k|k}) \cdot V_{dl,k|k} + (b_{k|k}) \cdot \left(\frac{I_c}{1000} + r \cdot \frac{I_d}{1000}\right)$$

$x_{k|k-1} = [V_{dl,k|k-1}]$

The equations of the parameter prediction model for the third estimator variant are provided as:

$$R_{o,k|k-1} = R_{o,k|k}$$

$$f_{k|k-1} = f_{k|k}$$

$$b_{k|k-1} = b_{k|k}$$

$$\rho_{k|k-1} = \begin{bmatrix} R_{o,k|k-1} \\ f_{k|k-1} \\ b_{k|k-1} \end{bmatrix}$$

The equations of the measurement model for the third estimator variant are provided as:

$$\hat{V}_t = V_o + \frac{I}{1000} \cdot R_{o,k|k-1} + V_{dl,k|k-1}$$

$$r = f_r(Q_{SOC,k|k}, T)$$

$$\hat{V}_{dl} = f_{k|k-1} \cdot (V_{dl,k|k} \cdot z^{-1}) + b_{k|k-1} \cdot \left(\frac{I_c}{1000} \cdot z^{-1} + \left(r \cdot \frac{I_d}{1000}\right) \cdot z^{-1}\right)$$

$$\hat{y} = \begin{bmatrix} \hat{V}_t \\ \hat{V}_{dl} \end{bmatrix}$$

The equations of the estimate correction model for the third estimator variant are provided as:

$$C_{VRV} = [I\ 1]$$

$$R_{VRV} = f_{R_{VRV}}(I)$$

$$x_{VRV,k|k-1} = \begin{bmatrix} R_{o,k|k-1} \\ V_{dl,k|k-1} \end{bmatrix}$$

$$e_{VRV} = V_t - \hat{V}_t$$

$$K_{VRV} = P_{VRV,k|k-1} \cdot C_{VRV}^t \cdot (C_{VRV} \cdot P_{VRV,k|k-1} \cdot C_{VRV}^t + R_{VRV})^{-1}$$

$$x_{VRV,k|k} = \begin{bmatrix} R_{o,k|k} \\ V_{dl,k|k} \end{bmatrix} = x_{VRV,k|k-1} + K_{VRV} \cdot e_{VRV}$$

$$P_{VRV,k|k} = (1 - K_{VRV} \cdot C_{VRV}) \cdot P_{VRV,k|k-1}$$

$$r = f_r(Q_{SOC,k|k}, T)$$

$$C_{fbb} = [V_{dl,k|k} \cdot z^{-1}(I_c \cdot z^{-1} + (r \cdot I_d) \cdot z^{-1})]$$

$$R_{fbb} = (1 + f_{k|k}) \cdot P_{VRV,k|k}$$

$$x_{fbb,k|k-1} = \begin{bmatrix} f_{k|k-1} \\ b_{k|k-1} \end{bmatrix}$$

$$e_{fbb} = V_{dl,k|k} - V_{dl}$$

$$K_{fbb} = P_{fbb,k|k-1} \cdot C_{fbb}^t \cdot (C_{fbb} \cdot P_{fbb,k|k-1} \cdot C_{fbb}^t + R_{fbb})^{-1}$$

$$x_{fbb,k|k} = \begin{bmatrix} f_{k|k} \\ b_{k|k} \end{bmatrix} = x_{fbb,k|k-1} + K_{fbb} \cdot e_{fbb}$$

$$P_{fbb,k|k} = (1 - K_{fbb} \cdot C_{fbb}) \cdot P_{fbb,k|k-1}$$

The equations of the error propagation model for the third estimator variant are provided as:

$$A_{VRV} = \begin{bmatrix} 1 & 0 \\ 0 & f_{k|k} \end{bmatrix}$$

$$Q_{VRV} = f_{Q_{VRV}}(Q_{SOC,k|k}, T, I)$$

$$Q_{fbb} = f_{Q_{fbb}}(Q_{SOC,k|k}, T, I)$$

$$P_{VRV,k|k-1} = A_{VRV} \cdot P_{VRV,k|k} \cdot A^t + Q_{VRV}$$

$$P_{fbb,k|k-1} = P_{fbb,k|k} + Q_{fbb}$$

$$P_{k|k-1} = \{P_{VRV,k|k-1}, P_{fbb,k|k-1}\}$$

The output of the third variant is provided as:

$$x_{k|k} = \lfloor V_{dl,k|k} \rfloor$$

$$\rho_{k|k} = \begin{bmatrix} R_{o,k|k} \\ f_{k|k} \\ b_{k|k} \end{bmatrix}$$

$$P_{k|k} = \{P_{VRV,k|k}, P_{fbb,k|k}\}$$

EC's are significantly affected by temperature and interact with any heat exchange system by generating and absorbing heat during reactions. A fourth variant provides a way to include thermodynamics and heat transfer to estimate the temperature of the reaction.

The input vector of the fourth variant is provided as:

$$u_{syn} = \begin{bmatrix} V_t \\ I \\ I_c \\ I_d \\ T_{cell,meas} \\ T_{coolant} \end{bmatrix}$$

where:

$$I = I_t - I_{SD}(Q_{SOC,k|k}, T_{cell})$$

$$I_c = \max(I, 0)$$

$$I_d = \min(I, 0)$$

The equations of the state prediction model for the fourth estimator variant are provided as:

$$\eta_{CE} = f_{chargeeff}(Q_{SOC,k|k}, T_{cell,k|k})$$

$$Q_{SOC,k|k-1} = Q_{SOC,k|k} + (\eta_{CE} \cdot I_c + I_d) \cdot \frac{1}{3600}$$

$$V_{dl,k|k-1} = f_{k|k} \cdot V_{dl,k|k} + b_{c,k|k} \cdot \frac{I_c}{1000} + b_{d,k|k} \cdot \frac{I_d}{1000}$$

$$T_{cell,k|k-1} = T_{cell,k|k} + \frac{I_t \cdot \left(V_t - V_o + \frac{T \cdot \Delta S}{nF}\right) + (hA_{eff,cell} \cdot (-T_{coolant} + T_{cell,k|k}))}{mC_{p,cell}}$$

$$\hat{x}_{k|k-1} = \begin{bmatrix} Q_{SOC,k|k-1} \\ V_{dl,k|k-1} \\ T_{cell,k|k-1} \end{bmatrix}$$

The equations of the parameter prediction model for the fourth estimator variant are provided as:

$$R_{o,k|k-1} = R_{o,k|k}$$

$$f_{k|k-1} = f_{k|k}$$

$$b_{c,k|k-1} = b_{c,k|k}$$

$$b_{d,k|k-1} = b_{d,k|k}$$

$$\rho_{k|k-1} = \begin{bmatrix} R_{o,k|k-1} \\ f_{k|k-1} \\ b_{c,k|k-1} \\ b_{d,k|k-1} \end{bmatrix}$$

The equations of the measurement model for the fourth estimator variant are provided as:

$$\hat{V}_t = f_{QtoV}(Q_{SOC,k|k-1}, T) + \frac{I}{1000} \cdot R_{o,k|k-1} + V_{dl,k|k-1}$$

$$\hat{V}_{dl} = f_{k|k-1} \cdot (\hat{V}_{dl} \cdot z^{-1}) + b_{c,k|k-1} \cdot \left(\frac{I_c}{1000} \cdot z^{-1}\right) + b_{d,k|k-1} \cdot \left(\frac{I_d}{1000} \cdot z^{-1}\right)$$

$$\hat{T}_{cell} = T_{cell,k|k-1}$$

$$\hat{y} = \begin{bmatrix} \hat{V}_t \\ \hat{V}_{dl} \\ \hat{V}_{cell} \end{bmatrix}$$

The equations of the estimate correction model for the fourth estimator variant are provided as:

$$C_{VRV} = \begin{bmatrix} f_{dVdQ}(Q_{SOC,k|k-1}, T) & 1 & 1 & 0 \\ 0 & 0 & 0 & 1 \end{bmatrix}$$

$$C_{fbb} = [V_{dl,k|k} \cdot z^{-1}\ I_d \cdot z^{-1}]$$

$$R_{VRV} = f_{R_{VRV}}(I)$$

$$R_{fbb} = (1 + f_{k|k}) \cdot P_{VRV,k|k}$$

$$x_{VRV,k|k-1} = \begin{bmatrix} Q_{SOC,k|k-1} \\ R_{o,k|k-1} \\ V_{dl,k|k-1} \\ T_{cell,k|k-1} \end{bmatrix}$$

$$\rho_{fbb,k|k-1} = \begin{bmatrix} f_{k|k-1} \\ b_{c,k|k-1} \\ b_{d,k|k-1} \end{bmatrix}$$

$$e_{VRV} = \begin{bmatrix} V_t \\ T_{cell,meas} \end{bmatrix} - \begin{bmatrix} \hat{V}_t \\ \hat{T}_{cell} \end{bmatrix}$$

$$K_{VRV} = P_{VRV,k|k-1} \cdot C_{VRV}^t \cdot (C_{VRV} \cdot P_{VRV,k|k-1} \cdot C_{VRV}^t + R_{VRV})^{-1}$$

$$x_{VRV,k|k} = \begin{bmatrix} Q_{SOC,k|k} \\ R_{o,k|k} \\ V_{dl,k|k} \\ T_{cell,k|k} \end{bmatrix} = x_{VRV,k|k-1} + K_{VRV} \cdot e_{VRV}$$

$$P_{VRV,k|k} = (I - K_{VRV} \cdot C_{VRV}) \cdot P_{VRV,k|k-1}$$

$$e_{fbb} = V_{dl,k|k} - \hat{V}_{dl}$$

$$K_{fbb} = P_{fbb,k|k-1} \cdot C_{fbb}^t \cdot (C_{fbb} \cdot P_{fbb,k|k-1} \cdot C_{fbb}^t + R_{fbb})^{-1}$$

$$\rho_{fbb,k|k} = \begin{bmatrix} f_{k|k} \\ b_{c,k|k} \\ b_{d,k|k} \end{bmatrix} = \rho_{fbb,k|k-1} + K_{fbb} \cdot e_{fbb}$$

$$P_{fbb,k|k} = (I - K_{fbb} \cdot C_{fbb}) \cdot P_{fbb,k|k-1}$$

The equations of the error propagation model for the fourth estimator variant are provided as:

$$A_{VRV} = \begin{bmatrix} 1 & 0 & 0 & 0 \\ 0 & 1 & 0 & 0 \\ 0 & 0 & f_{k|k} & 0 \\ 0 & 0 & 0 & \left(1 + \frac{hA_{eff,cell}}{mC_{p,cell}}\right) \end{bmatrix}$$

$$Q_{VRV} = f_{Q_{VRV}}(Q_{SOC,k|k}, T, I)$$

$$Q_{fbb} = f_{Q_{fbb}}(Q_{SOC,k|k}, T, I)$$

$$P_{VRV,k|k-1} = A_{VRV} \cdot P_{VRV,k|k} \cdot A_{VRV}^t + Q_{VRV}$$

$$P_{fbb,k|k-1} = P_{fbb,k|k} + Q_{fbb}$$

$$P_{k|k-1} = \{P_{VRV,k|k-1}, P_{fbb,k|k-1}\}$$

The output of the fourth variant is provided as:

$$x_{k|k} = \begin{bmatrix} Q_{SOC,k|k} \\ V_{dl,k|k} \\ T_{cell} \end{bmatrix}$$

$$\rho_{k|k} = \begin{bmatrix} R_{o,k|k} \\ f_{k|k} \\ b_{c,k|k} \\ b_{d,k|k} \end{bmatrix}$$

$$P_{k|k} = \{P_{VRV,k|k}, P_{fbb,k|k}\}$$

It is also anticipated that an array of ECSP estimators can be used to estimate multiple EC's in an array of EC's (e.g. battery). In another instance, a single estimator can operate using the average, minimum or maximum measurements of an array of EC's. In still another instance, a combination of estimators is used either chained together or working on different averages. For example, one estimator can operate on the average voltage of an array of EC's and estimate the average open circuit voltage ($V_o$) of the array. The average $V_o$ is then used by a bank of estimators (e.g. third variant type) that determine impedance for the individual EC's. In yet another instance, a single estimator is fed by multiple estimators. In a fuel cell, for example, multiple estimators estimate the $V_o$ of a individual EC's making up the fuel cell based on temperature. The $V_o$ values are processed by an impedance estimator to determine properties of the chemical reactions within the fuel cell.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, the specification and the following claims.

The invention claimed is:

1. A method of estimating a state of charge (SOC) and a state of health (SOH) of an electrochemical cell (EC), comprising:
    modeling said EC with a state prediction model and a parameter prediction model;
    measuring a terminal current of said EC;
    measuring a terminal voltage of said EC;
    measuring a temperature of said EC; and
    processing said state prediction model and said parameter prediction model through a time-varying state and parameter estimator based on said terminal current, said terminal voltage and said temperature to determine states and parameters of said EC, wherein said parameters include charge and discharge variables.

2. The method of claim 1 wherein said states include said SOC and ohmic resistance of said EC.

3. The method of claim 1 further comprising determining said SOH based on said charge variable and said discharge variable.

4. The method of claim 1 wherein said state prediction model and said parameter prediction model are process models that model changes in states and parameters of said EC based on current.

5. The method of claim 1 further comprising determining synthesized inputs based on said terminal current, said terminal voltage and said temperature wherein said processing is further based on said synthesized inputs.

6. The method of claim 1 wherein said step of processing said state prediction model and said parameter prediction model comprises:
    predicting current states based on prior states;
    predicting current error of said states based on prior errors of said states;
    determining current state gains based on said current error of said states; and
    updating said current states based on said prior states and said current state gains to provide said states of said EC.

7. The method of claim 6 wherein said states include said SOC and ohmic resistance of said EC.

8. The method of claim 6 wherein said state errors are continuously updated.

9. The method of claim 1 wherein said step of processing said state prediction model and said parameter prediction model comprises:
    predicting current parameters based on prior parameters;
    predicting current error of said parameters based on prior errors of said parameters;
    determining current parameter gains based on said current error of said parameters; and
    updating said current parameters based on said prior parameters and said current parameter gains to provide said parameters of said EC.

10. The method of claim 9 wherein said parameter errors are continuously updated.

11. A method of estimating states and parameters of an electrochemical cell (EC), comprising:
    modeling said EC with a state prediction model and a parameter prediction model;
    measuring a terminal current of said EC;
    measuring a terminal voltage of said EC;
    measuring a temperature of said EC;
    determining initial states and initial parameters; and
    processing said state prediction model and said parameter prediction model through a Kalman filter (KF)-based state and parameter estimator based on said terminal current, said terminal voltage, said temperature, said initial states and said initial parameters to determine said states and said parameters, wherein said parameters include charge and discharge variables.

12. The method of claim 11 wherein said states include a state of charge (SOC) and ohmic resistance of said EC.

13. The method of claim 11 further comprising determining a state of health (SOH) based on said charge variable and said discharge variable.

14. The method of claim 11 wherein said state prediction model and said parameter prediction model are process models that model changes in said states and parameters of said EC based on current.

15. The method of claim 11 further comprising determining synthesized inputs based on said terminal current, said terminal voltage and said temperature wherein said processing is further based on said synthesized inputs.

16. The method of claim 11 wherein said step of processing said state prediction model and said parameter prediction model comprises:
    predicting current states based on prior states;
    predicting current error of said states based on prior errors of said states;
    determining current state gains based on said current error of said states; and
    updating said current states based on said prior states and said current state gains to provide said states of said EC.

17. The method of claim 16 wherein said states include a state of charge (SOC) and ohmic resistance of said EC.

18. The method of claim 16 wherein said state errors are continuously updated.

19. The method of claim 11 wherein said step of processing said state prediction model and said parameter prediction model comprises:
   predicting current parameters based on prior parameters;
   predicting current error of said parameters based on prior errors of said parameters;
   determining current parameter gains based on said current error of said parameters; and
   updating said current parameters based on said prior parameters and said current parameter gains to provide said parameters of said EC.

20. The method of claim 19 wherein said parameter errors are continuously updated.

21. The method of claim 11 wherein said initial states and parameters are determined based on minimizing an initial error between said initial states and parameters and actual states and parameters.

22. A method of estimating states and parameters of an electrochemical cell (EC), comprising:
   modeling said EC with a state prediction model and a parameter prediction model based on characterization data of said EC;
   measuring a terminal current of said EC;
   measuring a terminal voltage of said EC;
   measuring a temperature of said EC; and
   processing said linear equation through a Kalman filter (KF)-based state and parameter estimator based on said terminal current, said terminal voltage, said temperature to determine said states and said parameters, wherein said parameters include charge and discharge variables.

23. The method of claim 22 wherein said characterization data includes the rate of change of a parameter based on a state.

* * * * *